United States Patent
Horng et al.

(10) Patent No.: US 7,423,848 B2
(45) Date of Patent: Sep. 9, 2008

(54) PROCESS AND STRUCTURE TO FABRICATE CPP SPIN VALVE HEADS FOR ULTRA-HIGH RECORDING DENSITY

(75) Inventors: Cheng T. Horng, San Jose, CA (US); Ru-Ying Tong, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 11/881,628

(22) Filed: Jul. 27, 2007

(65) Prior Publication Data

US 2007/0268633 A1 Nov. 22, 2007

Related U.S. Application Data

(62) Division of application No. 10/796,387, filed on Mar. 9, 2004, now Pat. No. 7,256,971.

(51) Int. Cl.
*G11B 5/39* (2006.01)
(52) U.S. Cl. .............................. 360/324.1; 360/324.11; 360/324.12
(58) Field of Classification Search ............... 360/324, 360/324.1, 324.11, 324.12, 324.2
See application file for complete search history.

(56) References Cited

U.S. PATENT DOCUMENTS

| | | | |
|---|---|---|---|
| 6,165,607 A | 12/2000 | Yamanobe et al. |
| 6,331,773 B1 | 12/2001 | Engel |
| 6,574,079 B2 | 6/2003 | Sun et al. |
| 6,581,272 B1 | 6/2003 | Li et al. |
| 6,621,666 B2 | 9/2003 | Miyauchi et al. |

(Continued)

FOREIGN PATENT DOCUMENTS

EP 0 883 196 A2 12/1998

(Continued)

OTHER PUBLICATIONS

"Influence of crystal structure and oxygen content on exchange-coupling properties of IrMn/CoFe spin-valve films," Appl. Phys. Letters, vol. 75, No. 23, Dec. 6, 1999, by Hiromi N. Fuke et al., pp. 3680-3682.

(Continued)

*Primary Examiner*—William J Klimowicz
(74) *Attorney, Agent, or Firm*—Saile Ackerman LLC; Stephen B. Ackerman

(57) ABSTRACT

A CPP-GMR spin value sensor structure with an improved MR ratio and increased resistance is disclosed. All layers except certain pinned layers, copper spacers, and a Ta capping layer are oxygen doped by adding a partial $O_2$ pressure to the Ar sputtering gas during deposition. Oxygen doped CoFe free and pinned layers are made slightly thicker to offset a small decrease in magnetic moment caused by the oxygen dopant. Incorporating oxygen in the MnPt AFM layer enhances the exchange bias strength. An insertion layer such as a nano-oxide layer is included in one or more of the free, pinned, and spacer layers to increase interfacial scattering. The thickness of all layers except the copper spacer may be increased to enhance bulk scattering. A CPP-GMR single or dual spin valve of the present invention has up to a threefold increase in resistance and a 2 to 3% increase in MR ratio.

11 Claims, 1 Drawing Sheet

U.S. PATENT DOCUMENTS

| | | | |
|---|---|---|---|
| 6,709,767 B2 * | 3/2004 | Lin et al. | 428/814 |
| 6,731,477 B2 * | 5/2004 | Lin et al. | 360/324.1 |
| 6,780,524 B2 * | 8/2004 | Lin et al. | 428/814 |
| 6,841,395 B2 * | 1/2005 | Linn et al. | 438/3 |
| 7,201,827 B2 | 4/2007 | Horng et al. | |
| 7,256,971 B2 * | 8/2007 | Horng et al. | 360/324.11 |
| 2002/0146580 A1 | 10/2002 | Wang et al. | |
| 2002/0161079 A1 | 10/2002 | Staller et al. | |
| 2003/0011940 A1 | 1/2003 | Tateyama et al. | |
| 2003/0184918 A1 | 10/2003 | Lin et al. | |
| 2004/0004261 A1 | 1/2004 | Takahashi et al. | |

FOREIGN PATENT DOCUMENTS

| | | | |
|---|---|---|---|
| WO | WO 2006006630 A1 | 1/2006 | |

OTHER PUBLICATIONS

"Low-Resistance Tunnel Magnetoresistive Head", by K. Ohashi et al., IEEE Trans. on Mag., vol. 36, No. 5, Sep. 2000, pp. 2549-2553.

"Oxygen as a surfactant in the growth of giant magneto-resistance spin valves", by W. F. Egelhoff, Jr. et al., J. Appl. Phys. 82 (12) Dec. 15, 1997, pp. 6142-6151.

"Spin-Valve Heads in the Current-Perpendicular-to-Plane Mode for Ultrahigh-Density Recording", by Atsushi Tanaka et al., IEEE Trans. on Mag., vol. 38, No. 1, Jan. 2002, pp. 84-88.

"The Applicability of CPP-GMR Heads for Magnetic Recording", by M. Takagishi et al., IEEE Trans. on Mag., vol. 38, No. 5, Sep. 2002, pp. 2277-2282.

* cited by examiner

PROCESS AND STRUCTURE TO FABRICATE CPP SPIN VALVE HEADS FOR ULTRA-HIGH RECORDING DENSITY

This is a Divisional application of U.S. patent application Ser. No. 10/796,387, filed on Mar. 9, 2004, which has now matured into U.S. Pat. No. 7,256,971 and is herein incorporated by reference in its entirety, and assigned to a common assignee.

FIELD OF THE INVENTION

The invention relates to processes and materials used in the fabrication of a giant magnetoresistive (GMR) sensor in a magnetic read head and in particular to a GMR sensor stack having a current-perpendicular-to-plane (CPP) configuration and oxygen doped layers.

BACKGROUND OF THE INVENTION

A magnetic disk drive includes circular data tracks on a rotating magnetic disk and read and write heads that may form a merged head attached to a slider on a positioning arm. During a read or write operation, the merged head is suspended over the magnetic disk on an air bearing surface (ABS). The sensor in a read head is a critical component since it is used to detect magnetic field signals by a resistance change. One form of magnetoresistance is a spin valve magnetoresistance (SVMR) or giant magnetoresistance (GMR) which is based on a configuration in which two ferromagnetic layers are separated by a non-magnetic conductive layer in the sensor stack. One of the ferromagnetic layers is a pinned layer in which the magnetization direction is fixed by exchange coupling with an adjacent anti-ferromagnetic (AFM) or pinning layer. The second ferromagnetic layer is a free layer in which the magnetization vector can rotate in response to external magnetic fields. The rotation of magnetization in the free layer relative to the fixed layer magnetization generates a resistance change that is detected as a voltage change when a sense current is passed through the structure. In a CPP configuration, a sense current is passed through the sensor in a direction perpendicular to the layers in the stack. Alternatively, there is a current-in-plane (CIP) configuration where the sense current passes through the sensor in a direction parallel to the planes of the layers in the sensor stack.

Ultra-high density (over 100 Gb/in$^2$) recording requires a highly sensitive read head. To meet this requirement, the CPP configuration is a stronger candidate than the CIP configuration which has been used in recent hard disk drives (HDDs). The CPP configuration is more desirable for ultra-high density applications because when the power consumption in the sensor is made constant to avoid a temperature rise, the output voltage is roughly inversely proportional to the square root of the sensor area. Therefore, a stronger output signal is achieved as the sensor size decreases. The sensor area at the ABS plane for greater than 100 Gb/in$^2$ density is smaller than 0.1×0.1 microns.

An important characteristic of a GMR head is the magnetoresistive (MR) ratio which is dR/R where dR is the change in resistance of the spin valve sensor and R is the resistance of the spin valve sensor before the change. A higher ratio is desired for improved sensitivity in the device and this result is achieved when electrons in the sense current spend more time within the magnetically active layers of the sensor. Bulk scattering in thicker magnetic layers improves the MR ratio but has limitations because a larger sensor size will affect the output voltage. Interfacial scattering which is the specular reflection of electrons at the interfaces between layers in the sensor stack also improves the MR ratio and thereby increases sensitivity.

In a CPP operation mode, a tunnel magnetoresistive (TMR) head as described by K. Ohashi et al. in "The Applicability of CPP-GMR Heads for Magnetic Recording", IEEE Trans. on Magnetism, Vol. 38, pp. 2277-2282 (2002), is a candidate for realizing high sensitivity. However, the TMR head has several disadvantages of which one is a large resistance that limits the operating frequency and makes the Johnson and shot noise high. It is considered too difficult to reduce TMR head resistance without a breakthrough in fabrication technology for low resistance barrier layers. For example, the current aluminum oxide barrier layer made from two atomic (111) Al layers is not pinhole free and thus has a very low dielectric breakdown voltage.

A CPP-GMR head is preferred over a TMR head design for ultra-high density recording because the former has a lower impedance. However, the resistance (RA) in a conventional single spin valve is too small (<100 mohm-μm$^2$) and the MR ratio of a CPP head is very low (<0.5%). Additionally, the output voltage which is related to the resistance change is too low. One way to increase the resistance change is to optimize the materials and structure of the CPP-GMR head.

In a CIP spin valve, the resistance change dR is related to the output amplitude. For a CPP spin valve, the corresponding resistance term is RA and the resistance change (output signal) is dRA. In a CPP operation mode, the MR ratio in the active area is determined by the materials in the pinned, spacer, and free layers and is related to the spin polarization at the interfaces between the pinned layer and spacer layer and between the spacer layer and free layer. Consequently, the resistance RA can be increased by implementing a thicker magnetic layer or with multi-magnetic layers. The former increases bulk scattering and the latter increases interfacial scattering. A very thin non-magnetic layer (dusting) can be inserted into a magnetic layer as an alternative method to increase interfacial scattering and RA.

A nano-oxide layer such as FeTaO described in U.S. Pat. No. 6,581,272 is used to increase specular reflection and improve the MR ratio in a bottom spin valve sensor having a synthetic anti-parallel pinned layer. A FeTaO layer about 5 Angstroms thick is inserted within a second CoFe pinned layer that is separated from a first CoFe pinned layer by a Ru coupling layer.

A synthetic anti-parallel (SyAP) spin valve sensor has a pinned layer structure that is a composite of multiple layers. Typically, a coupling layer is sandwiched between a first pinned layer and a second pinned layer that have slightly different thicknesses. The first pinned layer has a magnetic moment or vector oriented in a first direction by exchange coupling with an AFM pinning layer. The second pinned layer is adjacent to the free layer and is antiparallel exchange coupled to the first pinned layer via the coupling layer. Thus, the magnetic moment or vector of the second pinned layer is oriented in a second direction that is anti-parallel to the magnetic vector of the first pinned layer. The magnetic moments of the first and second pinned layers combine to produce a net magnetic moment that is less than the magnetic moment of a single pinned layer. A small net magnetic moment results in improved exchange coupling between the first pinned layer and the AFM layer and also reduces interlayer coupling between the pinned layer and the free layer.

As found in CIP heads, a higher MR ratio is realized by a dual type spin valve design in which two spin valves are formed adjacent to one another in the same sensor stack. Similarly, in a CPP head, a dual spin valve structure is preferred for improved performance. Thicker magnetic layers may be implemented to increase bulk scattering. It is noted that interfacial scattering is doubled in a dual CPP head compared to a single spin valve structure since the former has four magnetic/non-magnetic interfaces. Thus, RA and dRA which is the product of RA and the MR ratio can be greatly improved in the dual spin valve structure.

A sputtering target containing Mn, one other metal, and less than 1% oxygen is employed to form an AFM layer in a magnetic sensor in a read head as disclosed in U.S. Pat. No. 6,165,607. By incorporating oxygen in the sputtering target and presumably in the AFM layer, a more stable and homogeneous AFM layer is produced that leads to a higher exchange bias force.

A small amount of oxygen doped into an AFM layer has been used to improve the exchange bias field as reported by H. Fuke et al. in "Influence of Crystal Structure and Oxygen Content on Exchange-Coupling Properties of IrMn/CoFe SV Films" in Applied Phys. Letters, Vol. 75, pp. 3680-3682 (1999).

An AFM layer containing oxygen is also disclosed in U.S. Pat. No. 6,331,773 where a NiO AFM layer is used in a bottom spin valve structure to provide good wear properties. However, a NiFe oxidation protection layer that does not disrupt exchange bias is required between the NiO AFM layer and a synthetic pinned layer.

In U.S. Patent Application Publication No. 2004/0004261, a GMR element is described in which free and pinned layers have conduction electrons of different energy bands and are comprised of a half metal such as $Fe_3O_4$ which may be formed by molecular beam epitaxy with $O_2$ being admitted into the atmosphere while Fe is being deposited.

In U.S. Pat. No. 6,621,666, hard magnetic (bias) layers comprised of $CoFe_2O_3$ are formed on opposite sides of a spin valve stack but are not in the MTJ cell itself. The $CoFe_2O_3$ deposition involves a CoFe alloy target and Ar-10% $O_2$ as a sputtering gas.

An $Al_2O_3$ or NiCrOx insulating barrier is disclosed in U.S. Pat. No. 6,574,079 and is formed at low $O_2$ pressure during oxidation of an Al or NiCr layer.

In U.S. Patent Application Publication No. 2003/0184918, a longitudinal bias stack is formed between two spin valves and provides flux closures for the sense layers in the spin valve stacks. Copper oxide spacers are formed by magnetron sputtering with an Ar and $O_2$ gas mixture to reduce ferromagnetic coupling between pinned and sense layers.

A ferromagnetic nanocomposite layer comprised of CoFe nanogranules and an HfO intergranular matrix is described in U.S. Patent Application Publication No. 2002/0146580. A sputter deposition process involves a CoFeHf target and a trace amount of $O_2$ in the Ar sputter gas.

SUMMARY OF THE INVENTION

One objective of the present invention is to provide a CPP-GMR spin valve head that increases the resistance (RA) and MR ratio of an ultra-high density magnetic recording device.

A further objective of the present invention is to provide a sputtering method for forming the improved CPP-GMR spin valve head that can be applied to each magnetic layer in the sensor stack.

A still further objective of the present invention is to insert one or more non-magnetic films into a magnetic layer in the CPP-GMR spin value according to the previous objectives that will increase interfacial scattering in the spin valve structure.

Yet another objective of the present invention is to provide thicker films in the spin valve stack according to the first two objectives in order to increase bulk scattering.

These objectives are achieved in a first embodiment in which a substrate is provided that is typically the first magnetic shield layer (S1) in a magnetic read head. A sequence of layers is then deposited to form a sensor stack with a CPP-GMR configuration. A key feature is that all of the layers in the sensor stack with the exception of the first (outer) magnetic layer in the SyAP pinned layer, one or more spacer layers, and a capping layer are sputter deposited with an oxygen doped Ar gas. The sputtering system is preferably equipped with an ultra-high vacuum. The sputtering gas pressure is kept at less than 1 millitorr while the oxygen partial pressure is approximately $5 \times 10^{-9}$ torr.

In one embodiment, the sensor stack is comprised of a bottom seed layer which is a NiCr layer. A MnPt AFM layer is deposited next as a pinning layer. A synthetic anti-parallel (SyAP) pinned layer is then formed and includes a Ru coupling layer sandwiched between an AP2 CoFe layer with no oxygen dopant on the AFM layer and an AP1 CoFe layer. The AP1 layer may be further comprised of a nano-oxide layer (NOL) or a dusting layer that separates top and bottom portions of the CoFe layer to improve specular reflection. A Cu spacer is deposited on the AP1 layer followed by formation of an oxygen surfactant layer on the copper spacer to improve lattice matching between Cu and a subsequently deposited free layer. A free layer of CoFe or CoFe/NiFe is formed and in the case of a CoFe free layer may further contain an NOL or dusting layer to increase interfacial scattering. A second copper layer and a Ta layer are sequentially deposited to complete the sensor stack. Most layers in the stack may be made thicker to increase bulk scattering. The sensor stack is annealed and then the remainder of the read head is fabricated by a conventional method.

In a second embodiment, a dual spin valve with two AFM layers and one free layer is constructed by employing the sputtering method of the present invention. The structure of the first embodiment is followed through the formation of the copper spacer. In this case, the free layer formed on the copper spacer is preferably comprised of a bottom CoFe layer, a middle NiFe layer, and an upper CoFe layer. The middle NiFe layer may be comprised of an insertion layer. Next, a second copper spacer is formed on the free layer followed by a second oxygen surfactant layer (OSL) on the second copper spacer. A second synthetic pinned layer is then deposited and includes a second Ru coupling layer sandwiched between an AP3 CoFe layer on the second OSL and an upper AP4 CoFe layer. The AP3 layer may be further comprised of a nano-oxide layer (NOL) or a dusting layer that separates top and bottom portions of the CoFe layer to improve specular reflection. In this embodiment, both the AP2 and AP4 layers do not contain an oxygen dopant. A second AFM layer is deposited on the AP4 layer followed by a Ta capping layer to complete the dual spin valve structure. The sensor stack comprised of the dual spin valve structure is annealed and then the remainder of the read head is fabricated. For example, the second magnetic shield layer (S2) is typically used as the top conductor lead layer in a CPP spin valve. The second embodiment also encompasses thicker layers in the stack to increase bulk scattering.

DETAILED DESCRIPTION OF THE INVENTION

The present invention is a CPP-GMR spin valve structure for a sensor in a read head of a magnetic recording device and a method for making the same. The spin valve structure is especially suited for an ultra-high magnetic recording device wherein the recording density is greater than about 100 Gbits/in$^2$. The drawings are provided by way of example and are not intended to limit the scope of the invention. Although a bottom spin valve structure is described in the first embodiment, those skilled in the art will appreciate that the sputtering method of the present invention is equally applicable to forming a top spin valve structure. Moreover, the invention encompasses both single and dual spin valve structures.

Figure 1:
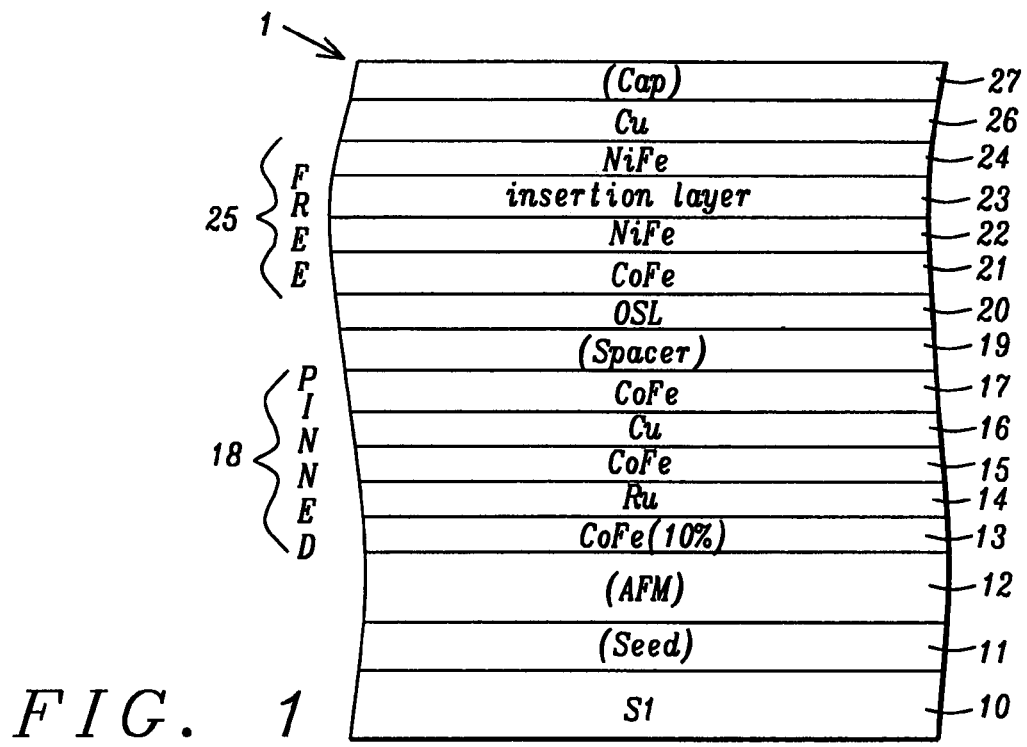
FIG. 1 is a cross-sectional view showing a CPP-GMR spin valve structure according to the first embodiment of the present invention.

A first embodiment is set forth in FIG. 1 in which a sensor comprised of a bottom CPP-GMR spin valve structure is illustrated. The inventors have found that magnetic layers doped with a small amount of oxygen significantly enhance the MR ratio of the spin valve element. However, the magnetic moment of an oxygen doped magnetic layer is reduced. For example, the magnetic moment of a CoFe layer doped with an oxygen content of 500 ppm is reduced by about 10-15%. To compensate for this loss, the thickness of a CoFe layer may be increased by about 10 to 15%.

A novel CPP-GMR spin valve structure 1 will be described first and then a method of forming the stack of layers in the spin valve structure will be provided. Referring to FIG. 1, a substrate 10 is shown that is typically a first magnetic shield layer (S1) in a read head. For example, the substrate 10 may be comprised of a 2 micron thick layer of an electroplated permalloy. Preferably, a thin Ta layer (not shown) about 10 Angstroms thick is formed on the electroplated permalloy by an argon sputter deposition method to form the upper layer in substrate 10 before the spin valve stack is deposited. A seed layer 11 that has a magnetoresistance enhancing property and is preferably comprised of NiCr is formed on the substrate 10. The seed layer 11 has a thickness between about 40 and 60 Angstroms and a composition of about 55 to 65 atomic % nickel. An AFM pinning layer 12 is formed on the seed layer 11 and is preferably comprised of MnPt having a composition between about 55 to 65 atomic % manganese. The AFM layer 12 has a thickness of about 125 to 175 Angstroms. Alternatively, the AFM layer 12 may be comprised of MnIr having a composition of about 18 to 22 atomic % Ir and a thickness of about 50 to 75 Angstroms.

A synthetic anti-parallel (SyAP) pinned layer 18 is formed on the AFM layer 12 and is preferably comprised of an AP2/Ru/AP1 configuration. The AP2 layer 13 which does not have an oxygen dopant is comprised of CoFe with a composition of about 75 to 90 atomic % cobalt and preferably 90% cobalt with a thickness of about 20 to 30 Angstroms. The magnetic moment of the AP2 layer 13 is pinned in a direction anti-parallel to the magnetic moment of the AP1 layer. The AP2 layer 13 may be slightly thinner than the AP1 layer to produce a small net magnetic moment for the pinned layer 18. Exchange coupling between the AP2 layer 13 and the AP1 layer is facilitated by a coupling layer 14 that is preferably comprised of Ru with a thickness of about 7.5 Angstroms. In one embodiment, the AP1 layer is comprised of CoFe and has a thickness of about 25 to 35 Angstroms. In a preferred embodiment, the AP1 layer is a composite layer that includes a lower CoFe layer 15, an upper CoFe layer 17, and a middle insertion layer 16 which is a nano-oxide layer (NOL) such as FeTaO or CoFeO with a thickness of about 2 to 3 Angstroms. The insertion layer 16 is employed to increase specular reflection of electrons within the AP1 layer. The AP1 CoFe layers 15, 17 have a composition of about 75 to 90 atomic % cobalt and have thicknesses of about 15 and 20 Angstroms, respectively. Optionally, a dusting of NiCr, Ta, or Cu having a thickness of between 1 and 3 Angstroms may be used as the insertion layer 16 instead of an NOL.

Alternatively, the AP1 layer is fabricated with multiple (CoFe/Cu/CoFe)$_n$ sandwich layers where n=2 or 3. The bottom and top CoFe layer in each sandwich layer have thicknesses of about 15 and 20 Angstroms, respectively, and the copper spacer is about 3 Angstroms thick. The CoFe layers are oxygen doped but the Cu spacer is not.

A copper spacer 19 with a thickness of about 25 Angstroms is formed on the SyAP pinned layer 18. In an alternative embodiment, an insertion layer (not shown) which is an oxygen surfactant layer may be formed within the copper spacer 19 by a method known to those skilled in the art. In a preferred embodiment, an oxygen surfactant layer (OSL) 20 is formed on the copper spacer 19 by exposing the copper spacer 19 to an oxygen ambient of 0.03 mtorr pressure for about two minutes in an oxidation chamber. The oxygen surfactant layer 20 is less than about 1 atomic layer in thickness and is used to improve lattice matching between the copper spacer 19 and an overlying magnetic layer. In other words, the oxygen surfactant layer 20 relieves stress in the spin valve structure 1 and is also used to grow a smooth overlying magnetic layer. It is understood that the oxygen surfactant layer 20 is an oxygen layer absorbed on the Cu spacer 19 and is not a copper oxide. Optionally, the OSL 20 may be omitted.

A free layer 25 is formed on the oxygen surfactant layer 20. In one embodiment (not shown), the free layer 25 is a single CoFe layer with a thickness of about 20 to 30 Angstroms. Preferably, the free layer 25 is a composite CoFe/NiFe layer comprised of a second insertion layer 23 sandwiched between NiFe layers 22, 24 in which the lower NiFe layer 22 is formed on a CoFe layer 21. The bottom layer in the free layer stack is a CoFe layer 21 that is formed on the OSL 20 and is about 5 to 10 Angstroms thick. The NiFe layers 22, 24 have a composition of about 75 to 85 atomic % Ni and have a combined thickness of between 30 and 40 Angstroms. The second insertion layer 23 is comprised of a dusting layer as described previously and serves to increase interfacial scattering within the free layer 25 and thereby increase RA.

The top of the sensor stack is comprised of a copper layer 26 with a thickness of about 100 Angstroms on the free layer 25 and a Ta or Ru capping layer 27 having a thickness of about 30 to 50 Angstroms on the copper layer 26. All of the layers with the exception of the AP2 layer 13, copper layers 19, 26, and the Ta capping layer 27 may have an oxygen content. As mentioned previously, the oxygen containing layers may be increased in thickness to offset a lower magnetic moment that results from the oxygen dopant in the magnetic layers. Furthermore, the AFM layer 12 preferably has an oxygen content to improve the exchange bias field and thereby make a thicker SyAP pinned layer viable. Note that increasing the oxygen partial pressure within the $1 \times 10^{-9}$ to $1 \times 10^{-8}$ torr range will also increase the exchange bias field within the AFM layer and thereby increase the MR ratio. Those skilled in the art will also appreciate that thicker magnetic layers will improve the bulk scattering.

In addition to a higher exchange bias strength of the AFM layer, the advantages of the CPP-GMR spin valve structure of the present invention are an increase in the resistance RA of up to threefold from <100 mohm-μm$^2$ to 200 mohms-μm$^2$ or greater and an increase in the MR ratio of 1 to 2% compared to a prior art CPP-GMR spin valve without oxygen dopant in the free layer, SyAP pinned layer, and AFM layer.

A key feature of the method for fabricating the CPP-GMR spin valve structure of the present invention is that all layers in the sensor stack with the exception of the OSL 20, CoFe AP2 layer 13, copper layers 16, 26, and Ta or Ru cap layer 27 are sputter deposited using an oxygen doped Ar gas at a pressure of less than 0.5 millitorr. Preferably, a DC magnetron sputter system such as one available from Anelva is employed that is capable of a base pressure of at least $1 \times 10^{-8}$ torr and preferably less than $5 \times 10^{-9}$ torr which is about 1 order of magnitude lower than a CVC system used in the art. A lower base pressure allows films to be sputter deposited with higher uniformity and reproducibility. It is understood that a sputter chamber may have multiple targets which are low pressure discharge cathodes. The oxygen partial pressure in the sputter gas is in the range of $1 \times 10^{-8}$ to $1 \times 10^{-9}$ torr and is preferably about $5 \times 10^{-9}$ torr. The oxygen content in the sputter gas is intended to produce an oxygen content in the sputter deposited layers of from 100 to 500 ppm. A higher oxygen dose may be used when depositing the AFM layer to enhance the exchange bias strength. Non-oxygen containing layers are deposited under similar conditions except that oxygen is omitted from the Ar sputter gas.

According to the preferred method of the first embodiment, a NiCr seed layer 11 and MnPt AFM layer 12 are sequentially sputter deposited with an $O_2$ doped Ar gas on the substrate 10. The NiCr seed layer 11 serves to increase the specular reflection at interfaces within the subsequently formed sensor stack. Optionally, a composite NiFeCr/NiFe layer that is sputter deposited with an $O_2$ doped Ar gas may be used as the seed layer 11 and an oxygen doped MnIr layer may be used in place of MnPt as the AFM layer 12. Next, the AP2 layer 13 is sputter deposited using a conventional Ar sputter gas method. Then the coupling layer 14, the bottom AP1 CoFe layer 15, the insertion layer 16, and the top AP1 CoFe layer 17 are sputter deposited in sequence in an oxygen doped Ar gas. Note that when a FeTaO or CoFeO nano-oxide layer is selected as the insertion layer 16, a higher concentration of oxygen than $1 \times 10^{-8}$ to $1 \times 10^{-9}$ torr may be used in the sputtering gas. Optionally, a 3 to 4 Angstrom thick iridium layer or a 5 to 6 Angstrom thick rhodium layer may be used instead of Ru as the coupling layer 14.

A copper spacer 19 is deposited next using a conventional Ar sputter gas method. Alternatively, an oxygen surfactant layer (not shown) may be included in the copper spacer 19 to improve interfacial scattering. Preferably, an OSL 20 is formed on the copper spacer 19 by an oxidation method known to those skilled in the art. It is believed that the oxygen in the OSL 20 reacts with a subsequently deposited CoFe layer to form CoFeO and thereby prevents interdiffusion between the copper spacer 19 and overlying free layer 25. The Cu/CoFe interface thus formed is flat and smooth.

The free layer 25 is sputter deposited in an $O_2$ doped Ar gas by sequentially forming the CoFe layer 21, bottom NiFe layer 22, second insertion layer 23, and the top NiFe layer 24. As indicated previously, when a NOL is employed as the second insertion layer, the oxygen partial pressure in the sputter gas may be increased to generate a FeTaO or CoFeO layer with the desired oxygen composition. Alternatively, the second insertion layer 23 is a dusting of NiCr or Ta having a thickness of about 1 to 3 Angstroms which is sputter deposited in an oxygen doped Ar gas. The oxygen doped Ar sputter method described herein is compatible with existing tools and does not affect throughput. All of the sputtered deposited films may be laid down in the same sputter chamber or in different sputter chambers within the same mainframe.

The top of the sensor stack is completed by sputter depositing the Cu layer 26 and then the Ta capping layer 27 with Ar in the absence of $O_2$. Preferably, the sensor structure 1 is annealed in a magnetic field between about 8000 and 12000 oersted at a temperature between about 250° C. and 300° C. for a period of 2 to 5 hours. The remainder of the read head may then be fabricated by a conventional process. Those skilled in the art will appreciate that in a CPP spin valve, the second magnetic shield layer (S2) is also used as the top conductor lead layer.

Figure 2:
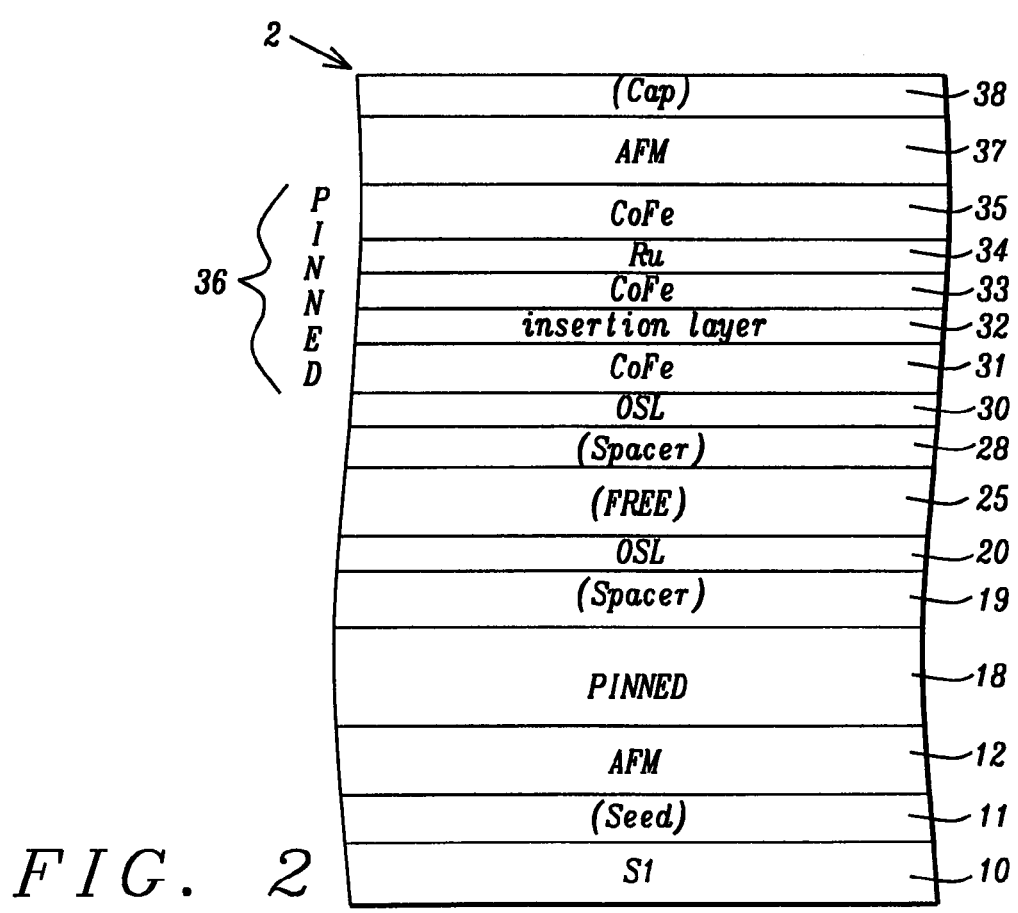
FIG. 2 is a cross-sectional view of a CPP-GMR dual spin valve structure according to a second embodiment of the present invention.

In a second embodiment, a dual CPP-GMR spin valve structure is formed as depicted in FIG. 2. Although a dual SyAP pinned spin valve is illustrated, a key feature of the present invention which is oxygen doped pinned, free, and AFM layers is also applicable to other types of dual spin valves as appreciated by those skilled in the art.

Referring to FIG. 2, the bottom portion of the dual spin valve structure 2 includes a majority of the layers in the spin valve described in the first embodiment. In particular, the stack comprised of a seed layer 11, a first AFM layer 12, a first SyAP pinned layer 18, copper spacer 19, and oxygen surfactant layer (OSL) 20 on the substrate 10 is part of a first spin valve in the CPP dual spin valve structure 2.

A second spin valve stack formed above the first spin valve will now be described. The combination of the second spin valve and the first spin valve form the preferred dual CPP-GMR sensor of the present invention. It is understood that the free layer 28 which is formed on the oxygen surfactant layer 20 is shared by the first and second spin valves. In the dual spin valve structure 2, the free layer 25 is preferably comprised of a CoFe/NiFe/CoFe configuration (not shown). The bottom CoFe layer in the free layer 25 is preferably about 5 to 10 Angstroms thick while the middle NiFe layer is about 30 to 40 Angstroms thick and the top CoFe layer is about 5 to 10 Angstroms thick. As described in the first embodiment, an insertion layer may be formed within a NiFe layer to increase interfacial scattering within the free layer. A copper layer with a thickness of about 25 Angstroms is formed as a second spacer 28 on the free layer 25. In a preferred embodiment, a second oxygen surfactant layer 30 with a thickness and function similar to the first oxygen surfactant layer 20 is formed on the second spacer 28. Optionally, the second oxygen surfactant layer 30 is omitted.

A second SyAP pinned layer 36 is formed on the second oxygen surfactant layer 30 and is preferably comprised of an AP3/Ru/AP4 configuration. In one embodiment, the AP3 layer is comprised of CoFe and has a thickness of about 30 to 35 Angstroms. Preferably, the AP3 layer is a composite layer that includes a lower CoFe layer 31, an upper CoFe layer 33, and a middle insertion layer 32 which is a nano-oxide layer such as FeTaO or CoFeO or a dusting of NiCr or Ta with a similar function and thickness as mentioned previously with regard to insertion layer 16. The magnetic moment of the AP3 layer has a size and direction similar to that of the AP1 layer. The magnetic moment of the AP4 layer 35 is pinned in a direction anti-parallel to the magnetic moment of the AP3 layer and has a size and direction similar to that of the AP2 layer. The AP4 layer 35 is comprised of CoFe and has a thickness of about 25 to 30 Angstroms which may be slightly thinner than the AP3 layer to produce a small net magnetic moment in the second pinned layer 36. Exchange coupling between the AP4 layer 35 and the AP3 layer is facilitated by a second coupling layer 34 that is comprised of Ru with a thickness of 7.5 Angstroms. Alternatively, a 3 to 4 Angstrom thick Ir layer or a 5 to 6 Angstrom thick rhodium layer may be used as the second coupling layer 34. The CoFe layers 31, 33 have thicknesses of about 20 and 15 Angstroms, respectively, and a composition of about 75 to 90 atomic % cobalt. The AP4 layer 35 has a cobalt content of about 75 to 90 atomic % cobalt and preferably about 10 atomic % cobalt.

There is a second AFM layer 37 comprised of MnPt with a thickness of between 150 and 200 Angstroms formed on the second SyAP pinned layer 36. The second AFM layer 37 has a similar composition to that of the first AFM layer 12 and optionally may be comprised of MnIr. The dual CPP-GMR spin valve of the present invention is completed with a Ta capping layer 38 having a thickness of about 30 to 50 Angstroms on the second AFM layer 37.

An important feature of the second embodiment is that in addition to the oxygen doped layers in the first spin valve, the second pinned layer and second AFM layer in the second spin valve are also doped with oxygen. Since the magnetic moment of an oxygen doped magnetic layer is reduced, the thickness of an oxygen doped layer may be increased to compensate for the loss. Note that the AFM layers 12, 37 may have a higher oxygen content than the CoFe layers in the CPP-GMR dual spin valve structure 2 to improve the exchange bias field and thereby make thicker SyAP pinned layers 18, 36 viable. A higher oxygen content in the AFM layers 12, 37 not only increases the exchange bias strength but also increases the MR ratio of the CPP dual spin valve. It is also understood that thicker magnetic layers will improve the bulk scattering.

In addition to a higher exchange bias strength of the AFM layers, the advantages of the CPP-GMR dual spin valve structure of the present invention are an increase in the resistance RA of about threefold from <100 mohm-$\mu m^2$ to 300 mohms-$\mu m^2$ or greater and an increase in the MR ratio of about 2 to 3% over prior art CPP-GMR dual spin valve structures without oxygen doping in the free layer, SyAP pinned layers, and AFM layers. As mentioned previously, a dual spin valve is generally preferred over a single spin valve because of a larger MR ratio associated with the former. The insertion layers which increase interfacial scattering also improve performance of the CPP-GMR spin valve compared to prior art structures that do not have the insertion layers. Furthermore, the addition of oxygen surfactant layers in the sensor structure relieves stress and improves the reliability of the device.

A key feature of the method for fabricating the CPP-GMR dual spin valve structure of the second embodiment is that all layers in the sensor stack with the exception of oxygen surfactant layers 20, 30, AP2 layer 13, AP4 layer 35, copper spacers 19, 28, and Ta layer are sputter deposited with an oxygen doped Ar gas at a pressure of less than 0.5 millitorr. Preferably, a DC magnetron sputter system such as one available from Anelva is employed that is capable of a base pressure of at least $1 \times 10^{-8}$ torr and preferably about $5 \times 10^{-9}$ torr which is about 1 order of magnitude lower than a CVC system used in the art. It is understood that a sputter chamber may have multiple targets which are low pressure discharge cathodes. The oxygen partial pressure in the sputter gas is in the range of $1 \times 10^{-8}$ to $1 \times 10^{-9}$ torr and is preferably less than $5 \times 10^{-9}$ torr. The oxygen content in the sputter gas is intended to produce an oxygen content in the sputter deposited layers of from 100 to 500 ppm. A higher oxygen dose may be used when depositing the AFM layers to enhance the exchange bias strength.

The sequence of forming the seed layer 11, first AFM layer 13, first SyAP pinned layer 18, spacer 19, and oxygen surfactant layer 20 is performed as described previously in the first embodiment. A method for depositing the remainder of the dual spin valve structure 2 will now be described. The free layer 25 is formed by sputter depositing in sequence a bottom CoFe layer, a middle NiFe layer, and a top CoFe layer using an oxygen doped Ar sputter gas. As described in the first embodiment, the NiFe layer may be comprised of an insertion layer to increase the interfacial scattering within the free layer and thereby increase RA. The copper spacer 28 is then formed on the free layer 25 by a conventional Ar sputtering method. A second oxygen surfactant layer 30 having a thickness of less than about 1 atomic layer is formed on the copper spacer 28 by the same method used to form the first oxygen surfactant layer 20. Next, the second SyAP pinned layer 36 with the exception of the AP4 layer 35 is sputter deposited in an $O_2$ doped Ar gas by forming the bottom AP3 CoFe layer 31, insertion layer 32, the top AP3 CoFe layer 33, and the second coupling layer 34 in sequence. The AP4 layer 35 is sputter deposited with a conventional Ar sputter gas. Note that when a FeTaO or CoFeO nano-oxide layer is selected as the insertion layer 32, a higher concentration of oxygen may be used in the sputtering gas in order to achieve the desired oxygen content. When a dusting of Ta is used instead of a nano-oxide layer as insertion layer 32, then oxygen is omitted from the sputtering gas for the insertion layer.

The top of the sensor structure is completed by sputter depositing a second AFM layer 37 in an oxygen doped Ar gas and then sputter depositing a Ta capping layer 38 using Ar gas without oxygen. The oxygen doped Ar sputter method described herein is compatible with existing tools and does not affect throughput. All of the sputtered deposited films may be laid down in the same sputter chamber or in different sputter chambers within the same mainframe. The CPP-GMR dual spin valve structure 2 is annealed in a magnetic field between about 8000 and 12000 oersted at a temperature between about 250° C. and 300° C. for a period of 3 to 5 hours. The remainder of the read head may then be fabricated by a conventional process. As mentioned previously, the second magnetic shield layer (S2) may also used as the top conductor lead layer in a CPP spin valve.

While this invention has been particularly shown and described with reference to, the preferred embodiment thereof, it will be understood by those skilled in the art that various changes in form and details may be made without departing from the spirit and scope of this invention.

We claim:
1. A CPP spin valve structure, comprising;
 (a) a substrate with an oxygen doped seed layer formed thereon;
 (b) an oxygen doped AFM layer on said oxygen doped seed layer;
 (C) an oxygen doped synthetic anti-parallel (SyAP) pinned layer on said oxygen doped AFM layer;
 (d) a copper spacer on the oxygen doped SyAP pinned layer;
 (e) an oxygen doped free layer above the copper spacer; and
 (f) a copper layer on the oxygen doped free layer and a capping layer on the copper layer.

2. The CPP spin valve structure of claim 1 wherein the oxygen doped seed layer is comprised of NiCr and has a thickness of about 40 to 60 Angstroms.

3. The CPP spin valve structure of claim 1 wherein the oxygen doped AFM layer is comprised of MnPt and has a thickness of about 125 to 175 Angstroms.

4. The CPP spin valve structure of claim 1 wherein the oxygen doped SyAP pinned layer is comprised of:
   (a) a non-oxygen doped AP2 CoFe layer with a thickness of about 20 to 30 Angstroms on said oxygen doped AFM layer;
   (b) an oxygen doped Ru coupling layer having a thickness of about 7.5 Angstroms on the AP2 CoFe layer; and
   (c) an oxygen doped AP1 CoFe layer with a thickness of about 25 to 35 Angstroms on the oxygen doped Ru coupling layer.

5. The CPP spin valve structure of claim 4 further comprised of an insertion layer in one or more of said oxygen doped AP1 CoFe layer, said oxygen doped free layer, and said copper spacer.

6. The CPP spin valve structure of claim 5 wherein the insertion layer is a nano-oxide layer with a thickness of about 2 to 3 Angstroms comprised of FeTaO or CoFeO.

7. The CPP spin valve structure of claim 5 wherein the insertion layer is a dusting of Cu, Ta, or NiCr that has a thickness of between 1 and 3 Angstroms.

8. The CPP spin valve structure of claim 1 further comprised of an oxygen surfactant layer having a thickness of less than about 1 atomic layer formed between the copper spacer and the oxygen doped free layer.

9. The CPP spin valve structure of claim 1 wherein the oxygen doped free layer is a composite layer comprised of a bottom CoFe layer with a thickness of about 5 to 10 Angstroms and an upper NiFe layer with a thickness of about 30 to 40 Angstroms.

10. The CPP spin valve structure of claim 1 wherein the capping layer is a 30 to 50 Angstrom thick film of Ta.

11. The CPP spin valve structure of claim 1 wherein the oxygen content in said oxygen doped layers is about 100 to 500 ppm.

* * * * *